United States Patent
Borowiec et al.

[11] Patent Number: 6,018,460
[45] Date of Patent: Jan. 25, 2000

[54] FLEXIBLE THERMAL CONDUCTOR WITH ELECTROMAGNETIC INTERFERENCE SHIELDING CAPABILITY FOR ELECTRONIC COMPONENTS

[75] Inventors: Joseph A. Borowiec, Brooklyn, N.Y.; Walter J. Picot, Randolph, N.J.

[73] Assignee: Lucent Technologies Inc., Murray Hill, N.J.

[21] Appl. No.: 09/006,414

[22] Filed: Jan. 13, 1998

[51] Int. Cl.[7] .................................................. H05K 7/20
[52] U.S. Cl. ......................... 361/704; 165/80.2; 165/185; 176/16.3; 176/35 GC; 257/718; 257/713; 361/16.3
[58] Field of Search .................................. 165/80.2, 80.3, 165/185; 176/16.3, 35 GC, 35 MS, 35 R; 257/706, 707, 712, 713, 718, 719; 361/704, 707, 710, 717, 719, 722, 816, 818

[56] References Cited

U.S. PATENT DOCUMENTS

| | | | |
|---|---|---|---|
| 4,069,497 | 1/1978 | Steidlitz | 361/717 |
| 4,855,867 | 8/1989 | Gazdik et al. | 361/719 |
| 4,999,741 | 3/1991 | Tyler | 174/16.3 |
| 5,257,162 | 10/1993 | Crafts | 174/16.3 |
| 5,548,482 | 8/1996 | Hatauchi et al. | 361/704 |
| 5,675,182 | 10/1997 | Moscicki | 361/717 |

*Primary Examiner*—Gregory Thompson

[57] ABSTRACT

A thermal conductor having electromagnetic interference shielding capabilities for electronic components. The conductor comprises a conductive strip and a support surface connected to the conductive strip. The conductive strip provides thermal conductivity and EMI shielding to the electronic components. The support surface maximizes the area of thermal contact between the conductive strip and the electronic component thereby maximizing the thermal conductivity of the conductor.

14 Claims, 1 Drawing Sheet

6,018,460

FLEXIBLE THERMAL CONDUCTOR WITH ELECTROMAGNETIC INTERFERENCE SHIELDING CAPABILITY FOR ELECTRONIC COMPONENTS

FIELD OF THE INVENTION

The present invention relates to the field of thermal conductors, and more particularly to a flexible thermal conductor with electromagnetic interference ("EMI") shielding capability for electronic components.

BACKGROUND OF THE INVENTION

Thermal conductors are widely used to cool electronic components, such as integrated circuits, whose performance can be adversely effected by excessive heat. Keeping the junction temperatures of such components as low as possible ensures longer mean-time-to-failure rates thereby prolonging the operating lifetime of such components. Such conductors cool components by dissipating heat from a higher temperature surface along a conducting material to a cooler surface such as a heat sink. Conventional thermal conductors are well known in the art with examples of such conductors being found in U.S. Pat. No. 5,412,535 to Chao et al. and U.S. Pat. No. 5,560,423 to Larson et al. Alternatively, some components are convection cooled where the heat from a hot surface is physically removed, such as by air from an electric fan. Conventional convection conductors are well known in the art with examples of such conductors being found in U.S. Pat. No. 4,535,386 to Frey et al and U.S. Pat. No. 5,258,888 to Korinsky.

Conventional systems employed for conduction cooling and convection cooling of electronic components suffer from a major drawback. They typically do not provide any EMI shielding capability for the component being cooled. Accordingly, electromagnetic magnetic radiation from the component being cooled can interfere with and prevent other components in an electronic device from functioning properly. In addition, the component being cooled is susceptible to electromagnetic interference from other device components and/or from sources outside the device.

It is therefore an object of the present invention to overcome the foregoing drawback of conventional conduction and convection cooling systems by providing an inexpensive, easy to install thermal conductor having EMI shielding capability for electronic components.

SUMMARY OF THE INVENTION

The present invention is a thermal conductor with electromagnetic interference shielding capabilities for electronic components. The conductor comprises a conductive strip and a support surface connected to the conductive strip. The conductive strip provides thermal conductivity and EMI shielding to the electronic components. The support surface provides support to the conductive strip such that thermal contact between the conductive strip and the electronic component is maximized. The support surface may also be thermally conductive. In one embodiment, the conductor further comprises a thermal pad for increasing thermal contact between the conductive strip and the electronic components.

DETAILED DESCRIPTION OF THE DRAWINGS

Figure 1:
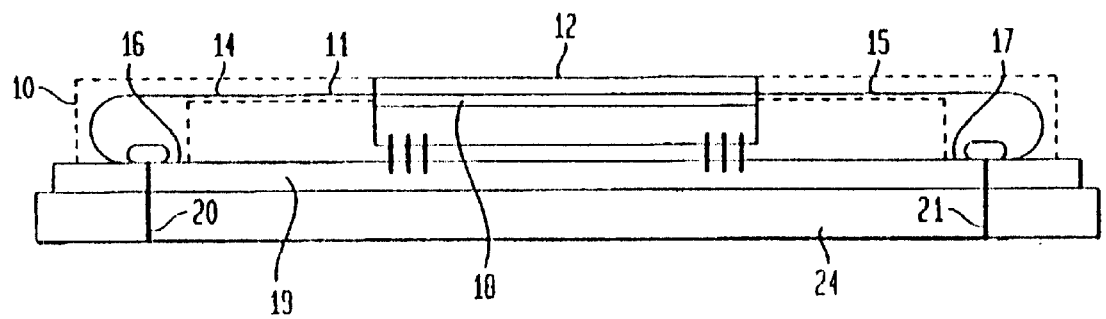
FIG. 1 shows a side view of an exemplary embodiment of a flexible, thermal conductor and EMI shield according to the present invention.

Referring to FIG. 1 there is shown an exemplary embodiment of a flexible, thermal conductor and EMI shield (FTCE) 10 for electronic components according to the present invention. FTCE 10 is comprised of conductive strip 11 and plate 12 which are coupled to one another. Conductive strip 11 is superposed atop electronic component 13 to conduct heat away from component 13. Conductive strip 11 includes flexible first arm 14 and flexible second arm 15 which extend outwards from beneath opposing ends of plate 12 and terminate at first end 16 and second end 17, respectively.

Plate 12 is thicker than conductive strip 11 and is positioned atop both conductive strip 11 and electronic component 13, thereby ensuring that a stiff, flat interface exists between conductive strip 11 and electronic component 13 in order to provide as large a surface area as possible for conducting heat. Compliant thermal pad 18 fills voids, such as air gaps, which exist between conductive strip 11 and electronic component 13, thereby maximizing the thermal conductivity of FTCE 10.

Note that plate 12 may be any support surface for enhancing thermal contact between conductive strip 11 and electronic component 13. For example, if electronic component 13 has a flat surface, plate 12 should be flat in order to provide conductive strip 11 with a good interface with electronic component 13, thereby enhancing the thermal contact between conductive strip 11 and electronic component 13. By contrast, if electronic component 13 has a curved surface, plate 12 should also be curved in order to provide conductive strip 11 with a good interface with electronic component 13.

Figure 2:
FIG. 2 shows an end view of the flexible, thermal conductor and EMI shield shown in FIG. 1.
Figure 3:
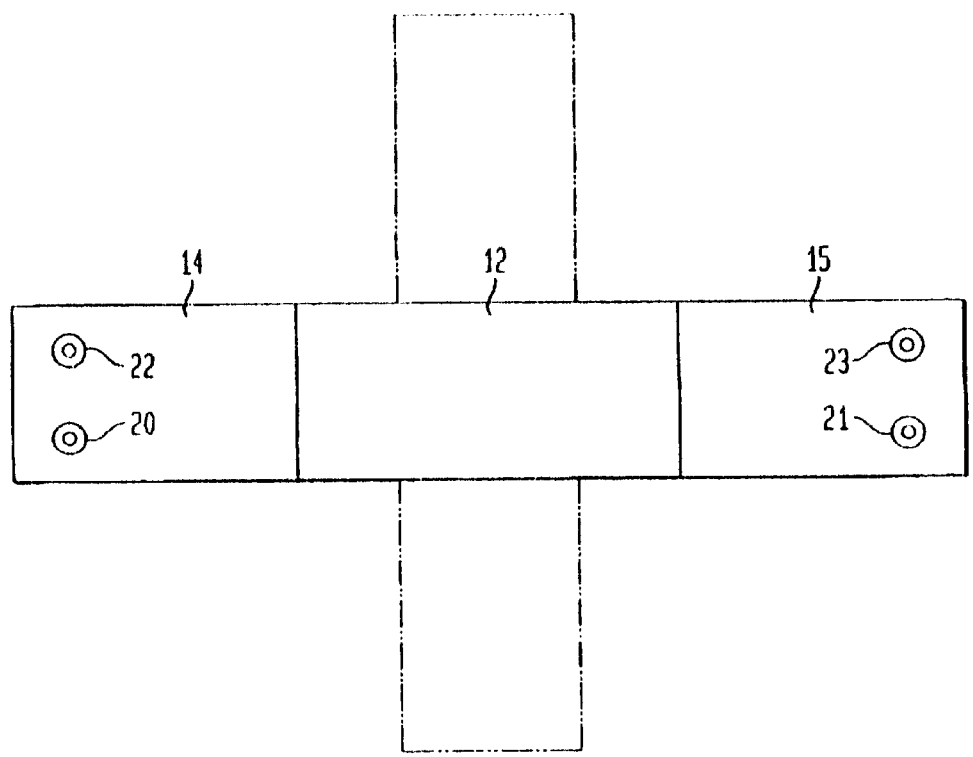
FIG. 3 shows a top view of the flexible, thermal conductor and EMI shield shown in FIG. 1.

As seen in FIGS. 1, 2 and 3, conductive strip 11 and plate 12 have rectangular shaped tops, conductive strip 11 has inverted u-shaped ends, and plate 12 has rectangular-shaped sides. Conductive strip 11 and plate 12 can, however, be fabricated in any shape. Conductive strip 11 and plate 12 are fabricated from copper although they can be fabricated from any conductive material.

Flexible arms 14 and 15 extend from plate 12 towards opposing ends of circuit board 19. As flexible arms 14 and 15 approach the opposing ends of circuit board 19, they curve down 180° back towards electronic component 13 such that ends 16 and 17 rest atop circuit board 19. In this manner, superposed conductive strip 11 encapsulates and creates an EMI shield for electronic component 13. To provide additional EMI shielding, conductive strip 11 can be fabricated to include a second pair of arms which are not shown and which extend outwards from opposing sides of plate 12 and are perpendicular to flexible arms 14 and 15.

FTCE 10 is secured to circuit board 19 by screws 20, 21, 22 and 23 which pass through ends 16 and 17 and circuit board 19 into base heat sink 24. Ends 16 and 17 can be fabricated to have apertures for these screws. To enhance the thermal conductivity of FTCE 10, circuit board 19 can include plated channels through which screws 20, 21, 22 and 23 pass. FTCE 10 can be secured to circuit board 19 by as few as two screws.

FTCE 10 cools electronic component 13 by conducting heat away from the top of component 13 along flexible arms 14 and 15 and screws 20, 21, 22 and 23 to base heat sink 24 where the heat can dissipate. FTCE 10 contacts electronic component 13 with sufficient force to conduct heat without mechanically damaging component 13. The conductivity of FTCE 10 can be altered by varying its thickness. Increasing the thickness of FTCE 10 enables it to have the thermal conductivity of conventional heat pipes.

Flexible arms 14 and 15 can flex both upwards and downwards, thereby enabling FTCE 10 to be used with electronic components of varying dimensions. The compact size of FTCE 10 enables it to be used in environments where space is limited such as laptop computers. FTCE 10 can be used to cool a variety of electronic components including those which are normally convection cooled such as Lucent Technologies Inc.'s ceramic 168 I/O Pin Grid Array Processor.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claims is reserved.

What is claimed is:

1. A thermal conductor and electromagnetic shield for an electronic component, comprising:
    a flexible conductive strip for providing an electronic component with a thermal conductive medium and an electromagnetic interference shield; and
    a support surface connected to the conductive strip for enhancing an area of thermal contact between the conductive strip and the electronic component, wherein the conductive strip includes a plurality of arms for conducting heat away from the electronic component, and wherein at least two of the plurality of arms each include an end adapted for coupling to a circuit board having a plurality of edges, each end extending away from the electronic component and curving down towards one of the plurality of edges and back towards the electronic component such that each end is adapted for resting atop the circuit board, thereby encapsulating and creating the electromagnetic shield for the electronic component.

2. The thermal conductor according to claim 1, wherein the conductive strip is adapted for being superposed atop the electronic component.

3. The device according to claim 2, wherein the support surface is adapted to provide a stiff, flat interface between the conductive strip and the electronic component for enhancing the conductivity of the conductor.

4. The device according to claim 1, wherein the plurality of arms are configured for movably flexing upwards and downwards.

5. The device according to claim 1, wherein the support surface includes two opposing ends and a different one of the plurality of arms extends outwards from beneath the two opposing ends.

6. The device according to claim 5, wherein the support surface further includes two opposing sides, the two sides being perpendicular to the two opposing ends and a different one of the plurality of arms extending outwards from beneath the two opposing sides.

7. The device according to claim 1, wherein the conductive strip and the support surface are fabricated from copper.

8. The device according to claim 1, wherein the support surface is thicker than the conductive strip.

9. A thermal conductor and electromagnetic shield for an electronic component, comprising:
    a flexible conductive strip having a pair of opposing ends for providing an electronic component with a thermal conductive medium and an electromagnetic interference shield; and
    a support surface connected to the conductive strip for enhancing an area of thermal contact between the conductive strip and the electronic component, wherein the conductive strip includes a plurality of flexible arms for conducting heat away from the electronic component, and wherein at least two of the plurality of arms each include an end adapted for coupling to a circuit board having a plurality of edges, each end extending away from the electronic component and curving down towards one of the plurality of edges and back towards the electronic component such that each end is adapted for resting atop the circuit board, thereby encapsulating and creating the electromagnetic shield for the electronic component.

10. The device according to claim 9, wherein the conductive strip is adapted for being superposed atop the electronic component.

11. The device according to claim 10, wherein the support surface is adapted to provide a stiff, flat interface between the conductive strip and the electronic component for conducting heat.

12. The device according to claim 9, wherein the conductive strip and the support surface are fabricated from copper.

13. The device according to claim 9, wherein the support surface is thicker than the conductive strip.

14. A method for providing a thermally conductive electromagnetic interference shield for electronic components, comprising the steps of:
    superposing a conductive strip having a pair of opposing ends atop an electronic component, wherein the conductive strip includes a plurality of flexible arms for conducting heat away from the electronic component, and wherein at least two of the plurality of arms each include an end adapted for coupling to a circuit board having a plurality of edges, each end extending away from the electronic component and curving down towards one of the plurality of edges and back towards the electronic component such that each end is adapted for resting atop the circuit board, thereby encapsulating and creating the electromagnetic shield for the electronic component.

* * * * *